(12) United States Patent
Nguyen Hoang et al.

(10) Patent No.: US 8,772,073 B2
(45) Date of Patent: Jul. 8, 2014

(54) INTEGRATED CIRCUIT MANUFACTURING METHOD

(75) Inventors: Viet Nguyen Hoang, Leuven (BE); Radu Surdeanu, Roosbeek (BE); Benoit Bataillou, Lyons (FR)

(73) Assignee: NXP, B.V., Eindhoven (NL)

( * ) Notice: Subject to any disclaimer, the term of this patent is extended or adjusted under 35 U.S.C. 154(b) by 159 days.

(21) Appl. No.: 12/988,110

(22) PCT Filed: Apr. 14, 2009

(86) PCT No.: PCT/IB2009/051546
§ 371 (c)(1),
(2), (4) Date: Oct. 15, 2010

(87) PCT Pub. No.: WO2009/128022
PCT Pub. Date: Oct. 22, 2009

(65) Prior Publication Data
US 2011/0037135 A1 Feb. 17, 2011

(30) Foreign Application Priority Data

Apr. 18, 2008 (EP) ..................................... 08103621
Apr. 14, 2009 (WO) ................... PCT/IB2009/051546

(51) Int. Cl.
*H01L 21/00* (2006.01)
*H01L 27/146* (2006.01)
*H01L 21/3105* (2006.01)

(52) U.S. Cl.
CPC .... H01L 27/14685 (2013.01); H01L 27/14629 (2013.01); H01L 27/14621 (2013.01); H01L 21/31053 (2013.01)
USPC ...................... 438/70; 257/432; 257/E31.127

(58) Field of Classification Search
USPC ............................................. 438/70; 257/432
See application file for complete search history.

(56) References Cited

U.S. PATENT DOCUMENTS 5,892,286 A 4/1999 Toyoda et al.
2004/0227170 A1 11/2004 Jiang et al.
2004/0257541 A1 12/2004 Iisaka
2006/0145223 A1* 7/2006 Ryu .............................. 257/294
2006/0209413 A1 9/2006 Kim et al.
2009/0302407 A1* 12/2009 Gidon et al. ................. 257/432

FOREIGN PATENT DOCUMENTS

EP 1801553 6/2007
WO 2007/004355 A1 1/2007
WO 2008/012235 A 1/2008

OTHER PUBLICATIONS

Correia, Jose Higino, et al; "A CMOS Optical Microspectrometer With Light-To-Frequency, Bus Interface, and Stray-Light Compensation"; IEEE Transactions on Instrumentation and Measurement, vol. 50, No. 6; (Dec. 2001).

(Continued)

Primary Examiner — Alexander Ghyka

(57) ABSTRACT

A method of providing a dielectric material (18) having regions (18', 18") with a varying thickness in an IC manufacturing process is disclosed. The method comprises forming a plurality of patterns in respective regions (20', 20") of the dielectric material (18), each pattern increasing the susceptibility of the dielectric material (18) to a dielectric material removal step by a predefined amount and exposing the dielectric material (18) to the dielectric material removal step. In an embodiment, the IC comprises a plurality of pixilated elements (12) and a plurality of light interference elements (24), each comprising a first mirror element (16) and a second mirror element (22), a region of the dielectric material (18) separating the first mirror element (16) and the second element (22), and each being arranged over one of said pixilated elements (12), the method further comprising forming the respective first mirror elements (16) in a dielectric layer (14) over a substrate (10) comprising the plurality of pixilated elements; depositing the dielectric material over the dielectric layer; and forming the respective second mirror elements such that each second mirror element is separated from a respective first mirror element by a region of the exposed dielectric material. Hence, an IC having a layer of a dielectric material (18) comprising regions of different thicknesses can be obtained requiring only a few process steps.

19 Claims, 3 Drawing Sheets

(56) References Cited

OTHER PUBLICATIONS

Correira, Jose H., et al; "A Single-Chip COMOS Optical Spectrometer With Light-To-Frequency Converter and Bus Interface"; IEEE Journal of Solid-State Circuits, vol. 37, No. 10; p. 1344-1347 (Oct. 2002).

International Search Report and Written Opinion for Application PCT/IB2009/051546 (Apr. 14, 2009).

* cited by examiner

INTEGRATED CIRCUIT MANUFACTURING METHOD

The present invention relates to a method of manufacturing an integrated circuit.

Nowadays, many examples exist of integrated circuits that have pixilated elements, e.g. light sensors, light emitting diodes, light valves and so on. In order for light to become available external to the IC or for an external light source to reach the pixilated element, the IC typically comprises a light path between the pixilated element and the outside world.

US patent application No. 2004/0227170 A1 discloses an IC comprising a plurality of photo diodes. Each photo diode is covered by a refractive index material having a refractive index higher than 1, which incorporates a color filter layer. The refractive index material provides a light path to the photo diode. The refractive index materials over the respective photo diodes are separated by air gaps to reduce the amount of cross talk between the photo diodes.

A problem associated with the manufacturing of color filters, and in particular polymer-based color filters is that they are deposited onto the IC relatively early in the manufacturing process, e.g. on top of the pixilated element in a front-end CMOS process. This complicates subsequent process steps such as the back-end process, because the color filters are not thermally stable. This also limits the applicability of such an IC to application domains in which exposure to high temperatures is avoided. For instance, in case the IC is integrated in a solid state lighting device, in which temperatures can exceed 80° C., the use of polymer-based color filters may be unsuitable.

Recently, interferometer-based color filters have been integrated into ICs. Such color filters may be formed in the back-end process, thus limiting the impact of the integration of the color filter on the IC manufacturing process because few subsequent steps (if any) follow the formation of such a light path acting as a color filter.

Figure 1A:
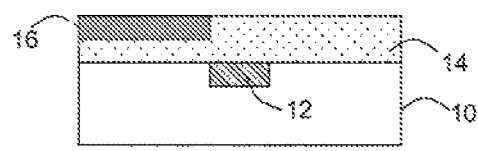
Figure 1B:
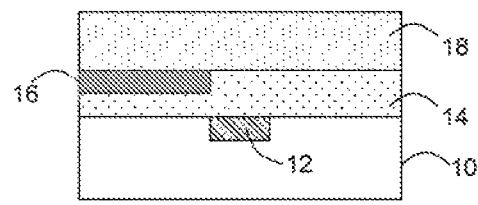
Figure 1C:
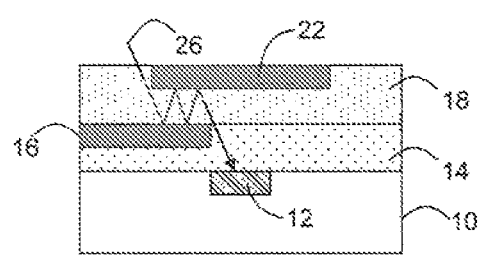

An example of a prior art light path manufacturing method using a conventional CMOS process is shown in FIG. 1A-C. A substrate 10 is provided with a pixilated element 12, and covered with a first dielectric layer 14. The first dielectric layer 14 is patterned, e.g. by means of a dry or wet etching step, after which a first metal layer 16 is formed in the patterned first dielectric layer 14. The patterned first dielectric layer 14 and the first metal layer 16 are subsequently covered with a second dielectric layer 18. The second dielectric layer 18 is subsequently patterned, e.g. by means of a dry or wet etching step, after which a second metal layer 22 is formed in the second dielectric layer 18. The first and metal layers act as reflective surfaces to the incident light 26 traveling through the first and second dielectric layers, thereby forming a Fabry-Perot type interferometer acting as a color filter.

The distance between the two mirrors, i.e. the first metal layer 16 and the second metal layer 22, of the interferometer determines at which wavelength constructive interference occurs. In other words, the thickness of the dielectric material 18 determines the wavelength at which constructive interference occurs. Hence, in order to provide an IC comprising multiple interferometers that select different wavelengths, each interferometer must have a different distance between its reflective metal layers. This means that the IC must comprise a large number of metal layers, thus adding to the complexity and the cost of the IC. Moreover, if the pixilated element is a sensor, the increased distance between the interferometer and the sensor reduces the sensitivity of the sensor due to light absorption in the longer light path to the sensor.

J. H. Correira et al. in 'A single-chip CMOS optical spectrometer with light-to-frequency converter and bus interface', IEEE Journal of Solid-State Circuits, Vol. 37, No. 10, 2002, pages 1344-1347 disclose a CMOS IC having a plurality of Fabry-Perot interferometers with varying dielectric thicknesses, with PECVD (plasma enhanced chemical vapour deposition) $SiO_2$ used as the dielectric between an Ag and an Al metal mirror. The different dielectric thicknesses of the respective Fabry-Perot interferometers are achieved by a plurality of patterning steps using a different photoresist mask for each patterning step. The multiple masks and patterning steps make this manufacturing process complex and expensive.

Hence, there exists a need for a simplified IC manufacturing method.

According to a first aspect of the present invention, there is provided a method of providing a dielectric material having regions with a varying thickness in an integrated circuit manufacturing process, the method comprising forming a plurality of patterns in respective regions of the dielectric material, each pattern increasing the susceptibility of the dielectric material to a dielectric material removal step by a predefined amount; and exposing the dielectric material to the dielectric material removal step.

Consequently, a layer of a dielectric material having a plurality of regions with different thicknesses can be obtained in a simple two-step process. The regions of such a layer of a dielectric material may for instance be used to separate the mirrors of respective light interference elements such as Fabry-Perot interferometers.

Hence, in an embodiment, the integrated circuit comprises a plurality of pixilated elements and a plurality of light interference elements, each of said light interference elements being arranged over one of said pixilated elements, each light interference element comprising a first mirror element and a second mirror element, a region of the dielectric material separating the first mirror element and the second element, the method further comprising forming the respective first mirror elements in a dielectric layer over a substrate comprising the plurality of pixilated elements; depositing the dielectric material over the dielectric layer; and forming the respective second mirror elements such that each second mirror element is separated from a respective first mirror element by a region of the exposed dielectric material. This provides a plurality of light interference elements having mirrors separated by different dielectric material thicknesses requiring only a single deposition step for the second mirror elements. The first and second mirror elements may comprise the same or different metals.

In an embodiment, the step of forming the respective second mirror elements comprises forming the second mirror elements in the dielectric material.

In an alternative embodiment, the step of forming the respective second mirror elements comprises forming the second mirror elements over the dielectric material. This demonstrates that the second mirror elements may be formed in any suitable way.

Preferably, the dielectric material removal step comprises a planarization step such as a chemical mechanical planarization step. Such planarization methods provide a good control over the thickness of the dielectric material.

In an embodiment, said patterns each comprise a plurality of recesses, wherein each pattern comprises a predefined recess density for increasing the susceptibility of the dielectric material to the dielectric material removal step by the predefined amount. It has been found that this yields good control over the thickness variations between respective regions of the dielectric material.

Figure 2A:
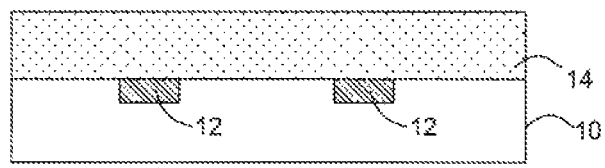
Figure 2B:
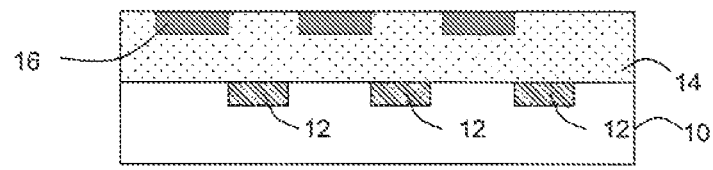
Figure 2C:
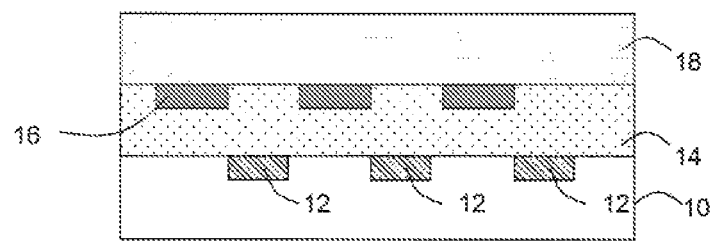
Figure 2D:
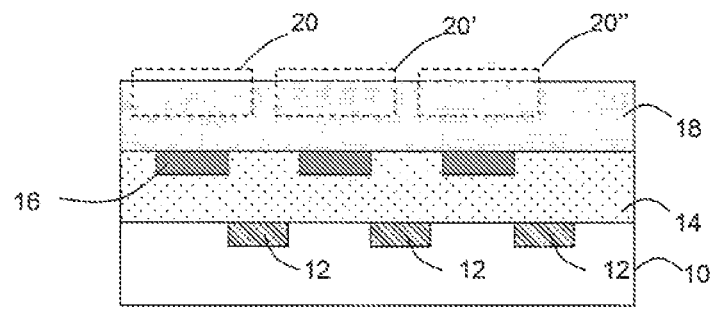
Figure 2E:
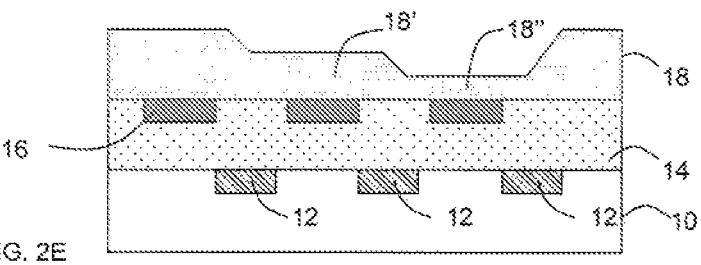
Figure 2F:
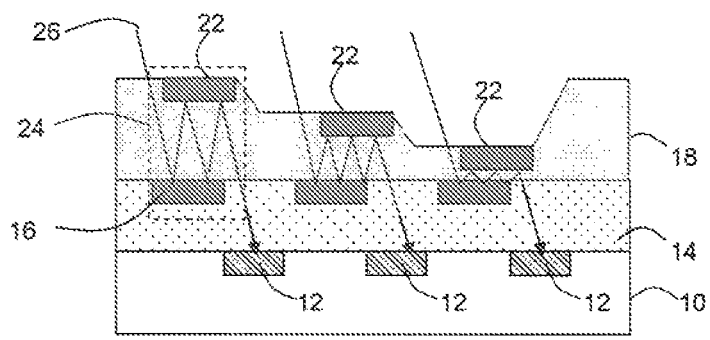
Figure 3:
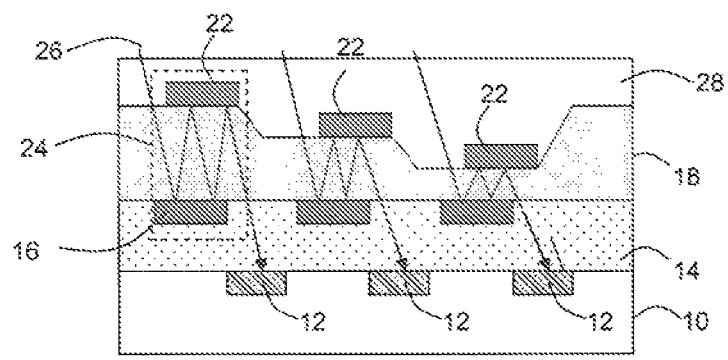

Embodiments of the invention are described in more detail and by way of non-limiting examples with reference to the accompanying drawings, wherein:

FIG. 1A-C depict a prior art light path manufacturing method;

FIG. 2A-F depict an IC manufacturing method according to an embodiment of the present invention; and FIG. 3 depicts an alternative step of the method depicted in FIG. 2A-F.

It should be understood that the Figures are merely schematic and are not drawn to scale. It should also be understood that the same reference numerals are used throughout the Figures to indicate the same or similar parts.

According to an embodiment of the manufacturing method of the present invention, a substrate 10 is provided comprising a pixilated element 12, as shown in FIG. 2A. Since the manufacture of such pixilated elements is well-known and the present invention is not concerned with the manufacturing of such elements per se, this will not be further explained for reasons of brevity only. The pixilated element may be any known pixilated element, such as a light sensitive element, e.g. a photo diode, a light emitting element, e.g. a light emitting diode or a light valve, e.g. a liquid crystal display pixel. Other examples will be apparent to the skilled person. The substrate 10 is typically covered by a dielectric layer 14, which again may be formed over the substrate 10 in any suitable manner, and may comprise any suitable dielectric material, e.g. silicon oxide, silicon nitride, a high-k dielectric and so on, as long as the material is at least partially transparent to the light from or to the pixilated elements 12.

In a next step, as shown in FIG. 2B, a plurality of mirror elements 16, e.g. metal portions are formed in the dielectric layer 14. The one or more metals used to form the mirror elements may be any suitable metal, such as Al, W, Cu, Ti or Ta in case of a CMOS process. The metal portions may be formed in any suitable way, e.g. by means of a Damascene process, or by patterning, the dielectric layer 14, e.g. by means of an etching step, after which the mirror elements 16 may be deposited in the patterned regions of the dielectric layer 14. It will be appreciated that the formation of mirror elements such as metal portions in a dielectric layer 14 is a routine skill for the person skilled in the art, and its specific implementation is not essential to the teachings of the present invention. For this reason, the formation of the first mirror elements 16 are not discussed in further detail for reasons of brevity only.

It is further emphasized that the substrate stack shown in FIG. 2A and FIG. 2B may comprise additional layers between the dielectric layer 14 and the substrate 10. These layers, if present, must be at least partially transparent to the light from or to the pixilated elements 12.

In a next step shown in FIG. 2C, a dielectric material 18 is deposited over the dielectric layer 14. The dielectric material 18 may be deposited in any suitable way, e.g. by means of (PE)CVD. The dielectric material 18 may be any suitable dielectric material for forming the dielectric between the mirrors of an interferometer such as a Fabry-Perot interferometer. For instance, the dielectric material 18 may be silicon oxide.

Subsequently, as shown in FIG. 2D, selected regions of the dielectric material 18 are patterned. The patterns have the function of increasing the susceptibility of the dielectric material 18 to a subsequent dielectric material removal step, or, in other words, to reduce the resistance of the dielectric material 18 to such a step. The increase in susceptibility can be tuned by tuning the pattern density.

For instance, in FIG. 2D, a first region 20 of the dielectric material 18 over a first mirror element 16 does not comprise a pattern, which means that the susceptibility of the dielectric material 18 to a subsequent dielectric material removal step in this region has not been altered. However, the regions 20' and 20" of the dielectric material 18 over the respective first mirror elements 16 both comprise a pattern of recesses formed in the dielectric material 18, e.g. by a selective etching step, with the region 20" having a higher pattern density than the region 20', i.e. a higher number of recesses per unit area of the dielectric material 18.

Consequently, the region 20" has a higher susceptibility to a subsequent dielectric material removal step than the region 20', which both have a higher susceptibility to a subsequent dielectric material removal step than the region 20. This is because the effective density of the dielectric material 18 in regions 20' and 20" has been reduced by the patterns. It will be appreciated that the effective density of the dielectric material 18 may be reduced in other suitable ways, e.g. by providing a plurality of patterns having the same number of recesses, with the recesses of different patterns having different widths.

Next, the patterned dielectric layer 18 is exposed to a dielectric material removal step, such as an etching step or a planarization step such as a chemical mechanical planarization (CMP) step. It has been found that CMP provides especially good results. As can be seen in FIG. 2E, the different patterns in the different regions 20' and 20" cause an increase in the rate of removal of the dielectric material 18, with the increase in rate scaling with the density of the pattern. This yields regions 18' and 18" in the dielectric material 18 having a reduced thickness compared to the regions of the dielectric material in which no pattern has been formed. Hence, the patterns in the regions 20' and 20" ensure that the dielectric material 18 is more quickly removed in these regions compared to the unpatterned regions 20.

It will be appreciated that the regions 20' and 20" typically experience two different material removal rates during this removal process: a first rate at which the pattern is removed, and a second, lower rate, at which a part of the unpatterned dielectric material 18 under each of the patterns in regions 20' and 20" is removed. Obviously, any unpatterned region of the dielectric material 18 only experiences the second, lower rate, thus yielding an increased thickness of such a region compared to a patterned region, e.g. region 20' or region 20".

In short, the dielectric material removal step provides a thinning of the dielectric material 18, with the patterns in the regions 20' and 20" increasing the thinning rate of the dielectric material 18 in said regions.

Next, as shown in FIG. 2F, a plurality of second mirror elements 22 is deposited over respective first mirror elements 16 such that a first mirror element 16 and a second mirror element 20 are separated by a region of the dielectric material 18, thereby forming a Fabry-Perot interferometer. Because the respective regions of the dielectric material 18 have different thicknesses, a plurality of Fabry-Perot interferometers is obtained that are selective to light 26 of different wavelengths, since the wavelength for which constructive interference occurs in the interferometer depends on the thickness of the dielectric material between the two mirrors, as previously explained.

In FIG. 2F, the second mirror elements 22, e.g. further metal portions, which may be the same metal as the metal used for the first mirror elements 16, are deposited in the dielectric material 18. To this end, the dielectric layer may be patterned in any suitable manner, e.g. by means of an etching step, to provide trenches for the deposition of the second mirror elements 22 in said trenches. Alternatively, the further metal portions, e.g. Cu portions, may be formed by means of a Damascene process.

It will be appreciated that the formation of mirror elements such as metal portions in the dielectric material 18 is a routine skill for the person skilled in the art, and its specific implementation is not essential to the teachings of the present invention. For this reason, the formation of the second mirror elements 22 are not discussed in further detail for reasons of brevity only.

Alternatively, the second mirror elements 22 may be deposited on top of the dielectric material 18, as shown in FIG. 3, e.g. by means of selective deposition or by means of the patterning of a metal layer deposited over the dielectric material 18. The substrate stack may be further subjected to processing steps to finalize the manufacture of the IC, e.g. by depositing a planarization layer 30 over the dielectric layer 18.

It is reiterated that although FIG. 2F and FIG. 3 show light 26 as incident light, the interferometers 24 may also be used for filtering light transmitted by or through the pixilated elements 12. The interferometers 24 may for instance be used as color filters.

Hence, the method of the present invention facilitates the manufacture of N interferometers 24 (N being at least 2) having different wavelength filtering properties by means of a single patterning step of the dielectric material 18 and a single metal deposition step to form the second mirror elements 22, thereby providing a significant simplification of the known manufacturing processes such as disclosed in the paper by J. H. Correira et al.

At this point, it is emphasized that the application of a plurality of patterns in a number of regions of the dielectric material 18 to achieve a layer of the dielectric material 18 having a variable thickness over the width of the layer has been explained in the context of the formation of interferometers 24 on the substrate stack including pixilated elements 12. It should however be appreciated that the use of different patterns in different regions of the dielectric material 18 to locally increase the susceptibility of the dielectric material 18 to a subsequent dielectric material removal step may be applied in the manufacture of any IC requiring a layer of a dielectric material comprising a plurality of regions with different thicknesses.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A method of providing a dielectric material having regions with respective different thicknesses in an integrated circuit manufacturing process, the method comprising:
    forming a plurality of concurrently-residing patterns in respective regions of the dielectric material, each pattern configured and arranged for setting the susceptibility of the dielectric material to a dielectric material removal step by a predefined amount whereby the plurality of concurrently-residing patterns correspond to the respective different thicknesses; and
    exposing the dielectric material to the dielectric material removal step, and using concurrently-residing the patterns to provide the respective different thicknesses;
    wherein the step of exposing the dielectric material to the dielectric removal step provides a first removal rate in certain regions of the dielectric material and a second rate, lower than the first removal rate, in other regions of the dielectric material.

2. A method according to claim 1, wherein the integrated circuit comprises a plurality of pixilated elements and a plurality of light interference elements, each of said light interference elements being arranged over one of said pixilated elements, each light interference element comprising a first mirror element and a second mirror element, a region of the dielectric material separating the first mirror element and the second element, the method further comprising:
    forming the respective first mirror elements in a dielectric layer over a substrate comprising the plurality of pixilated elements;
    depositing the dielectric material over the dielectric layer; and
    forming the respective second mirror elements such that each second mirror element is separated from a respective first mirror element by a region of the exposed dielectric material.

3. A method according to claim 2, wherein the step of forming the respective second mirror elements comprises forming the second mirror elements in the dielectric material.

4. A method according to claim 2, wherein the step of forming the respective second mirror elements comprises forming the second mirror elements over the dielectric material.

5. A method according to claim 1, wherein the dielectric material removal step comprises a planarization step.

6. A method according to claim 5, wherein the planarization step is a chemical mechanical planarization step.

7. A method according to claim 1, wherein each of said patterns comprises a plurality of recesses with a predefined recess density for setting the susceptibility of the dielectric material to the dielectric material removal step by the predefined amount, whereby the dielectric material removal step, as concurrently applied to each of said patterns, results in the dielectric material having the respective regions with different thicknesses.

8. A method according to claim 2, wherein the plurality of light interference elements are arranged to act as a plurality of color filters.

9. A method according to claim 2 wherein the light interference elements are Fabry-Perot interferometers.

10. A method according to claim 2 wherein the first mirror element comprises a first metal.

11. A method according to claim 2, wherein the second mirror element comprises a second metal.

12. An integrated circuit manufactured by the method of claim 1.

13. A method of providing a dielectric material having regions with respective different thicknesses in an integrated circuit manufacturing process, the method comprising:
    providing a plurality of pixilated elements in a substrate and covering the substrate with a dielectric layer;
    forming a plurality of first mirror elements in the dielectric layer;
    depositing a dielectric material over the dielectric layer;

patterning a plurality of regions of the dielectric material to set the susceptibility of the dielectric material to a dielectric material removal step by a predefined amount;

exposing the dielectric material to the dielectric material removal step, and using the patterns concurrently provided to provide the respective different thicknesses; and depositing a plurality of second mirror elements on the dielectric material.

14. The method according to claim 13, wherein the plurality of pixilated elements are photodiodes.

15. A method of providing a dielectric material having regions with respective different thicknesses in an integrated circuit manufacturing process, the method comprising:

providing a plurality of pixilated elements in a substrate and covering the substrate with a dielectric layer;

forming a plurality of first mirror elements in the dielectric layer;

depositing a dielectric material over the dielectric layer;

patterning a plurality of regions of the dielectric material to set the susceptibility of the dielectric material to a dielectric material removal step by a predefined amount;

exposing the dielectric material to the dielectric material removal step to provide the dielectric material with regions of respective different thicknesses; and depositing a plurality of second mirror elements on the dielectric material, wherein the step of exposing the dielectric material to the dielectric removal step provides a first removal rate in the patterned regions of the dielectric material and a second lower rate in unpatterned regions of the dielectric material.

16. The method according to claim 13 further comprising a step of depositing a planarization layer after the step of depositing a plurality of second mirror elements.

17. The method according to claim 1, wherein the second rate is a lower rate than the first rate, and wherein the step of exposing the dielectric material to the dielectric removal step provides a first removal rate in the patterned regions of the dielectric material and a second rate, different than the first removal rate, in unpatterned regions of the dielectric material.

18. A method according to claim 2, wherein the step of forming the respective second mirror elements comprises forming the second mirror elements in the dielectric material, and wherein the step of exposing the dielectric material to the dielectric removal step provides a first removal rate in certain regions of the dielectric material and a second rate, lower than the first removal rate, in other regions of the dielectric material.

19. A method according to claim 2, wherein the step of exposing the dielectric material to the dielectric removal step provides a first removal rate in certain regions of the dielectric material and a second rate, lower than the first removal rate, in other regions of the dielectric material, wherein the dielectric material removal step comprises a planarization step, wherein the step of forming the respective second mirror elements comprises forming the second mirror elements in the dielectric material.

* * * * *